(12) United States Patent
Yamazaki et al.

(10) Patent No.: US 9,000,591 B2
(45) Date of Patent: Apr. 7, 2015

(54) CONDUCTIVE FILM AND SEMICONDUCTOR DEVICE

(71) Applicant: Kabushiki Kaisha Toshiba, Tokyo (JP)

(72) Inventors: Yuichi Yamazaki, Tokyo (JP); Makoto Wada, Kanagawa (JP); Tatsuro Saito, Kanagawa (JP); Tadashi Sakai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/768,567

(22) Filed: Feb. 15, 2013

(65) Prior Publication Data

US 2013/0249093 A1    Sep. 26, 2013

(30) Foreign Application Priority Data

Mar. 26, 2012    (JP) ................................. 2012-070004

(51) Int. Cl.
*H01L 23/48*    (2006.01)
*H01L 23/498*    (2006.01)
*H01L 23/532*    (2006.01)
*B82Y 30/00*    (2011.01)

(52) U.S. Cl.
CPC ....... *H01L 23/49866* (2013.01); *Y10S 977/734* (2013.01); *B82Y 30/00* (2013.01); *H01L 23/53276* (2013.01); *H01L 2924/0002* (2013.01)

(58) Field of Classification Search
CPC .................. H01L 23/49866; H01L 21/76807; H01L 21/76843; H01L 21/76846; H01L 21/76849; H01L 21/76852; H01L 21/76862; H01L 21/76876; H01L 21/76877; H01L 23/5226; H01L 23/528; Y10S 977/734
USPC .................... 257/29, 750, E23.165, E29.068; 977/734; 327/527

See application file for complete search history.

(56) References Cited

U.S. PATENT DOCUMENTS

2011/0006425 A1*  1/2011  Wada et al. ................... 257/750
2012/0228614 A1   9/2012  Kitamura et al.

FOREIGN PATENT DOCUMENTS

| JP | 2009-143761 A | 7/2009 |
| JP | 2010-212619 | 9/2010 |
| JP | 2012-56309 A | 3/2012 |
| WO | WO 2012/031037 A1 | 3/2012 |

OTHER PUBLICATIONS

U.S. Appl. No. 13/224,929, filed Sep. 2, 2011, Makoto Wada.
Japanese Office Action issued Jul. 29, 2014 in Patent Application No. 2012-070004 with English Translation.
Vladimir Labunov et al., "Multi-level Composite Nanostructures Based on the Arrays of Vertically Aligned Carbon Nanotubes and Planar Graphite Layers", Phys. Status Solidi A, Applications and Materials Science, vol. 208, No. 2, Nov. 8, 2010, pp. 453-458.

* cited by examiner

*Primary Examiner* — Kyoung Lee
*Assistant Examiner* — Ratisha Mehta
(74) *Attorney, Agent, or Firm* — Oblon, McClelland, Maier & Neustadt, L.L.P.

(57) ABSTRACT

A conductive film of an embodiment includes: a fine catalytic metal particle as a junction and a graphene extending in a network form from the junction.

10 Claims, 6 Drawing Sheets

CONDUCTIVE FILM AND SEMICONDUCTOR DEVICE

CROSS-REFERENCE TO RELATED APPLICATION

This application is based upon and claims the benefit of priority from Japanese Patent Applications No. 2012-070004, filed on Mar. 26, 2012; the entire contents of which are incorporated herein by reference.

FIELD

Embodiments described herein relate generally to a conductive film and a semiconductor device.

BACKGROUND

A graphene is a two-dimensional nanomaterial composed of carbon atoms. This material has remarkably excellent properties such as a high current-density resistance, an ultra-high mobility, a high heat resistance, and a high mechanical strength, and therefore has been regarded as a promising wiring material for a semiconductor device similarly to a carbon nanotube. For example, a graphene nanoribbon shaped into a width of about 10 nm is theoretically expected to have an electrical conductivity higher than that of copper. Under the circumstance, studies have been made on the use of the graphene in wirings. A single-layered graphene sheet cannot have a low resistance similar to that of a metal, and a multi-layered graphene sheet with a large area has to be produced at a low temperature to realize the low resistance.

Currently, the multi-layered graphene sheet with a large area is generally produced by growing the graphene on a thin film of a catalytic metal such as Ni, Fe, or Co at a high temperature of 800° C. or higher in a CVD process. From the viewpoint of suitability for semiconductor processes, the catalytic metal is desirably Ni or Co, and the growth temperature is desirably 600° C. or lower.

DETAILED DESCRIPTION

A conductive film of an embodiment includes: a fine catalytic metal particle as a junction and a graphene extending in a network form from the junction.

A semiconductor device of an embodiment includes: a substrate, an insulation film disposed on the substrate, and a conductive film disposed on the insulation film, wherein the conductive film contains a fine catalytic metal particle as a junction and a graphene extending in a network form from the junction, and the graphene in the conductive film is separated from the insulation film by a gap.

Embodiments will be described below with reference to the drawings.

The conductive film of the embodiment contains the fine catalytic metal particle as the junction, and the graphene extends therefrom in the network form. The graphene may be formed between the fine catalytic metal particles.

The conductive film of the embodiment has a two- or three-dimensional conductive network. The graphene can extend in various directions from the starting point of the fine catalytic metal particle M. Therefore, the conductive film can be used not only as a transverse wiring on a plane surface, but also as a via wiring extending in a vertical direction (between layers) or as a three-dimensional wiring containing an integrated combination of the transverse and vertical wirings.

The conductive film of the embodiment may further contain another graphene layer free from the fine catalytic metal particle M.

(Embodiment 1)

Figure 1:
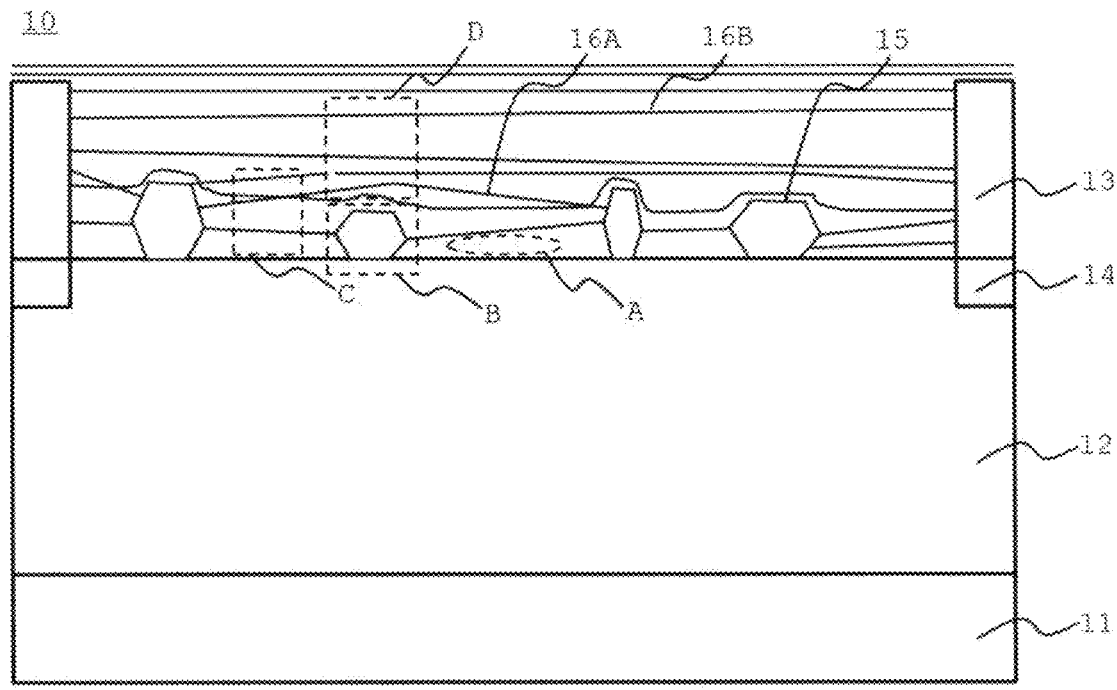
FIG. 1 is a conceptual view of a semiconductor device according to Embodiment 1.

FIG. 1 is a conceptual cross-sectional view of a semiconductor device 10 having a conductive film according to Embodiment 1. The semiconductor device 10 contains a semiconductor substrate 11, an insulation film 12 disposed on the semiconductor substrate 11, bonding portions 14 embedded in a surface of the insulation film 12, catalytic metal portions 13 disposed on the bonding portions 14, fine catalytic metal particles 15 disposed on the insulation film 12, graphenes 16A disposed between the fine catalytic metal particles 15 or between the fine catalytic metal particle 15 and the catalytic metal portion 13, and graphenes 16B stacked over the graphenes 16A. The semiconductor device 10 may further contain, in addition to the graphenes 16A and 16B, another graphene or the like formed between the catalytic metal portions 13 keeping away from the fine catalytic metal particles 15. In FIG. 1, among two components symmetrically arranged, only one component is marked with a reference sign. Furthermore, only one graphene is marked with the reference sign 16A, and only one graphene is marked with the reference sign 16B. All the graphenes represented by solid lines between the fine catalytic metal particles 15 or between the fine catalytic metal particle 15 and the catalytic metal portion 13 correspond to the graphenes 16A, and all the graphenes represented by solid lines between the catalytic metal portions 13 correspond to the graphenes 16B.

In Embodiment 1, the conductive film contains the graphenes 16A in combination with the fine catalytic metal particles 15, and further contains the graphenes 16B stacked over the graphenes 16A. The graphenes 16B are formed also above the catalytic metal portions 13. The conductive film is electrically connected to the catalytic metal portions 13.

In FIG. 1, in a region A surrounded by a dashed line, a gap is formed between the insulation film 12 and the graphene 16A. In general, when a graphene is in contact with an insulation film, the graphene interacts with an atom in a main component (such as $SiO_2$) of the insulation film, whereby an essential property of the graphene is deteriorated. In Embodiment 1, the graphene 16A is hardly affected by the insulation film 12 due to the gap of the region A. This is because the graphene 16A is connected to the fine catalytic metal particle 15 and thereby may be separated from the insulation film 12.

In FIG. 1, in a region B surrounded by a dashed line, the graphene 16A is affected by the fine catalytic metal particle 15. Meanwhile, in a region C surrounded by a dashed line, the graphene 16A is not affected by the fine catalytic metal particle 15. In the region B, the graphene 16A is affected by the fine catalytic metal particle 15 connected thereto, whereby an essential property of the graphene 16A is deteriorated. However, unlike a usual graphene formed on a Cu film or the like, not all the parts of the graphene 16A are in contact with the metal. Thus, in the region C and the like, though the graphene 16A is the closest to the insulation film 12, the graphene 16A can be prevented from being affected by the metal and the insulation film 12. In the region C, the graphene 16A can advantageously exhibit the essential graphene properties.

In FIG. 1, in a region D surrounded by a dashed line, the graphenes 16A and 16B are above the fine catalytic metal particle 15, not in contact with the fine catalytic metal particles 15. Some of the graphenes 16A between the fine catalytic metal particles 15 are formed above one fine catalytic metal particle 15, and therefore can be prevented from being affected by the fine catalytic metal particle 15 and the insulation film 12.

Thus, in FIG. 1, the graphenes 16A and 16B are hardly affected by the insulation film 12 and the fine catalytic metal particles 15 in the regions other than the region B. Because only a small percentage of the graphenes 16A is contained in the region B, the graphenes 16A can be mostly prevented from being adversely affected by the external factors.

In Embodiment 1, the semiconductor substrate 11 is a substrate having a semiconducting function. The semiconductor substrate 11 may be a device substrate such as a transistor or a diode, a multi-layered semiconductor structure such as an LSI, or a photoelectric conversion device such as a solar cell.

In Embodiment 1, the insulation film 12 is a film having an insulation property such as a silicon oxide film.

In Embodiment 1, the catalytic metal portion 13 may contain a catalytic metal such as a metal selected from Cu, Ni, Co, Fe, Ru, Ti, In, Pt and the like, an alloy containing two or more metals selected from the group including the above metals, or an alloy composed of two or more metals selected from the group including the above metals. Though the catalytic metal portion 13 has a vertical surface in FIG. 1, the surface may be partially or entirely inclined. The total number of the graphenes depends on the thickness of the catalytic metal portion 13. For example, the catalytic metal portion 13 has a thickness of 10 to 50 nm. In a case where the graphenes are grown not at a high temperature of 800° C. or higher but at a low temperature of 300° C. to 700° C., the catalytic metal portion 13 preferably contains Ni or Co. Furthermore, in such a low-temperature process, the catalytic metal portion 13 preferably has a facet, which often acts as a starting point for the graphene growth. The facet of this embodiment includes an {nn0} or {n00} surface of the catalytic metal, and has a surface length of 1 to 50 nm. The {nn0} or {n00} surface readily acts as a starting point for the graphene growth.

In Embodiment 1, the bonding portion 14 is a member excellent in bonding to both of the insulation film 12 and the catalytic metal portion 13. Specific examples of materials for the bonding portion 14 include Ti, TiN, and TaN. The catalytic metal portion 13 is often poor in bonding to the insulation film 12. When the catalytic metal portion 13 is formed directly on the insulation film 12, the catalytic metal portion 13 is often readily peeled off from the insulation film 12. In view of preventing the peeling, the bonding portion 14 is preferably placed between the insulation film 12 and the catalytic metal portion 13. In a case where the conductive film is used after separated from the insulation film 12, it is preferred that the bonding portion 14 is not formed.

In Embodiment 1, the fine catalytic metal particles 15 are prepared from a thin film of the above-mentioned catalytic metal deposited on the insulation film 12, and are dispersed on the insulation film 12. The thin film of the catalytic metal has a thickness of 1 to 5 nm. The fine catalytic metal particles 15 have a particle diameter of 1 to 100 nm.

(Embodiment 2)

Figure 2:
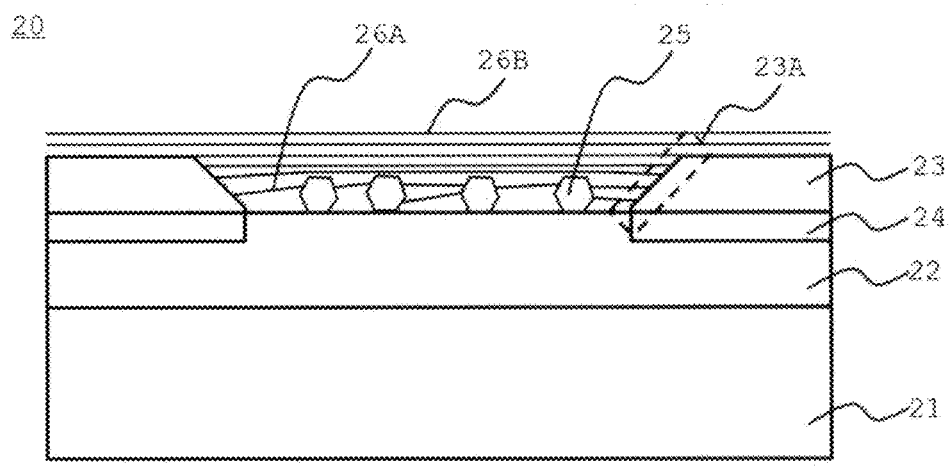
FIG. 2 is a conceptual view of a semiconductor device according to Embodiment 2.
Figure 3:
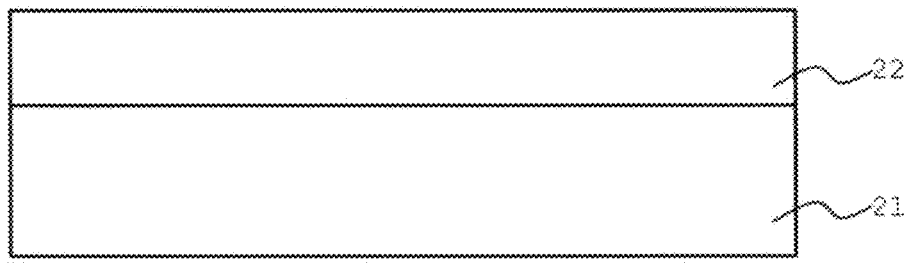
FIG. 3 is a conceptual view of a process for producing the semiconductor device of Embodiment 2.
Figure 4:
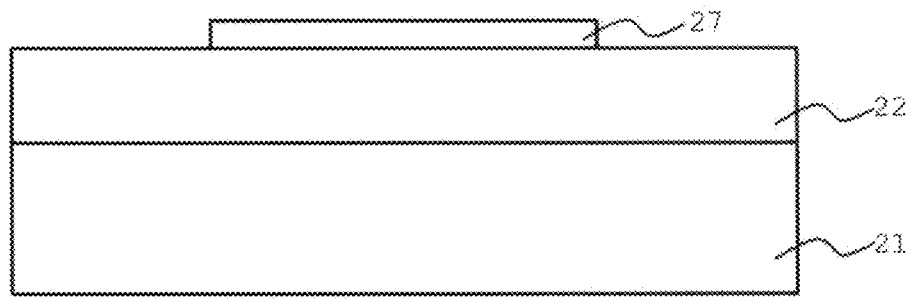
FIG. 4 is a conceptual view of a process for producing the semiconductor device of Embodiment 2.
Figure 5:
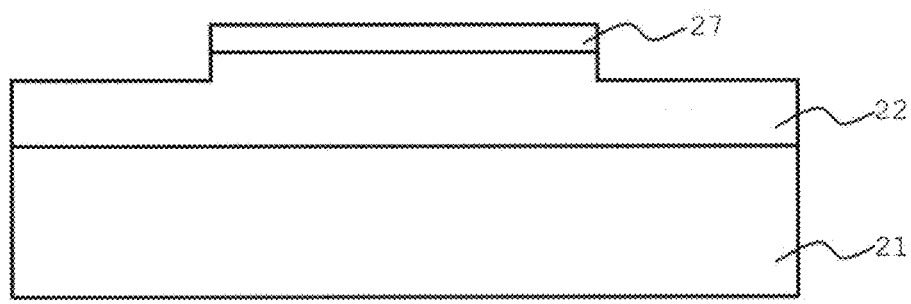
FIG. 5 is a conceptual view of a process for producing the semiconductor device of Embodiment 2.

As shown in the conceptual view of FIG. 2, a semiconductor device 20 according to Embodiment 2 contains a semiconductor substrate 21, an insulation film 22 disposed on the semiconductor substrate 21, bonding portions 24 embedded in a surface of the insulation film 22, catalytic metal portions 23 disposed on the bonding portions 24, fine catalytic metal particles 25 disposed on the insulation film 22, graphenes 26A disposed between the fine catalytic metal particles 25 or between the fine catalytic metal particle 25 and the catalytic metal portion 23, and graphenes 26B stacked over the graphenes 26A. The semiconductor device 20 of Embodiment 2 is the same as the semiconductor device 10 of Embodiment 1 except that the catalytic metal portions 23 each have a facet surface 23A.

A method for producing the semiconductor device 20 of Embodiment 2 will be described below with reference to the conceptual process views of FIGS. 3 to 8. The processes of FIGS. 3 to 6 may be carried out using common technologies for a known semiconductor device or the like. As shown in the conceptual process view of FIG. 3, the insulation film 22 is formed on the semiconductor substrate 21. As shown in the conceptual process view of FIG. 4, a mask 27 for forming the bonding portions 24 is placed on the components of FIG. 3. As shown in the conceptual process view of FIG. 5, in the insulation film 22 in the components of FIG. 4, regions exposed from the mask 27 are partially removed using a lithographic technique. As shown in the conceptual process view of FIG. 6, the bonding portions 24 are deposited on the components of FIG. 5. Thus, the bonding portions 24 are embedded in the removed regions of the insulation film 22 . After the embedding of the bonding portions 24, the mask 27 is removed.

Figure 6:
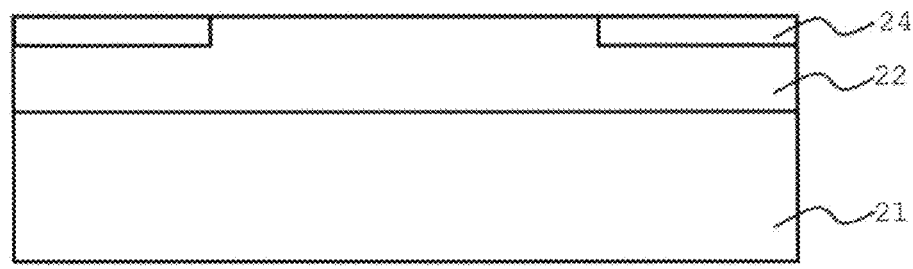
FIG. 6 is a conceptual view of a process for producing the semiconductor device of Embodiment 2.
Figure 7:
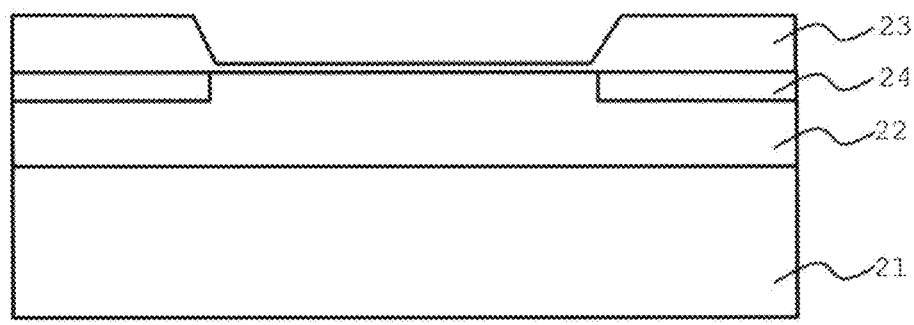
FIG. 7 is a conceptual view of a process for producing the semiconductor device of Embodiment 2.

As shown in the conceptual process view of FIG. 7, a catalytic metal film 23 having a nano-scale thickness is deposited on the components of FIG. 6 using a CVD process or the like. The conditions for forming the catalytic metal film 23 are preferably selected to control the thickness of the catalytic metal film 23 as follows. The bonding portions 24 are excellent in reactivity with a material gas containing a component metal for the catalytic metal film 23, and the catalytic metal film 23 is readily deposited on the bonding portions 24. The catalytic metal film 23 has a thickness of 10 to 50 nm on the bonding portions 24. Meanwhile, in regions not covered with the bonding portions 24, the catalytic metal film 23 is deposited on the insulation film 22. The insulation film 22 is poor in the reactivity with the material gas containing the component metal for the catalytic metal film 23, and the catalytic metal film 28 is not readily deposited on the insulation film 22. Therefore, the catalytic metal film 23 has a thickness of 1 nm or more but less than 5 nm on the insulation film 22. In a case where the bonding portions 24 are not formed in the semiconductor device 20, the film forming conditions may be varied to obtain the catalytic metal film 23 having various thicknesses. The facet surface 23A may be formed by a heating treatment in an atmosphere such as an $H_2$, Ar, or $N_2$ gas atmosphere, a plasma pretreatment using the gas, or the like. The facet surface 23A preferably has an angle of approximately 35° to 55°. The plane of the catalytic metal film 23 may be oriented to a {111} surface to form the facet surface 23A more easily. The amount of the fine catalytic metal particles 25 on the insulation film 22 can be controlled by changing the thickness of the catalytic metal film 23 on the insulation film 22.

Figure 8:
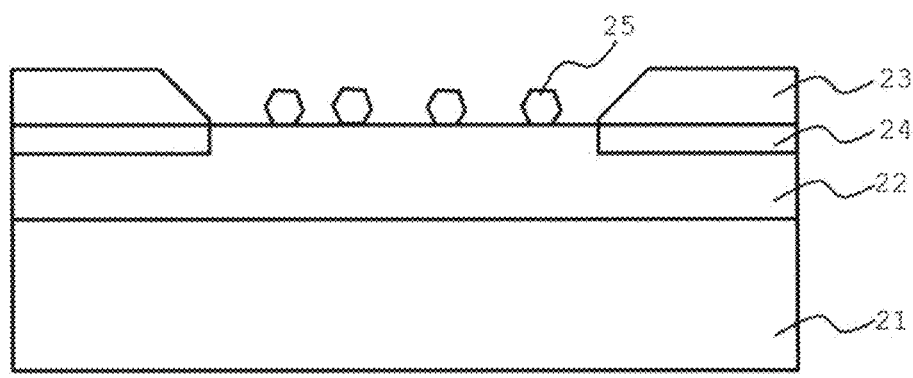
FIG. 8 is a conceptual view of a process for producing the semiconductor device of Embodiment 2.

As shown in the conceptual process view of FIG. 8, the components of FIG. 7 are subjected to a plasma pretreatment, whereby the catalytic metal film 23 on the insulation film 22 is converted to the fine particles. The plasma pretreatment for the microparticulation is carried out using a gas of $H_2$, Ar, $N_2$, or the like for a treatment time of 30 to 300 seconds at a treatment temperature of 25° C. to 300° C. This treatment may be carried out once using the gas or twice or more using the different gases.

After the microparticulation, the resultant components is subjected to a low-temperature ultrathin carbon film growth treatment and a carbon growth treatment using a plasma CVD process, so that the semiconductor device 20 of FIG. 2 is produced. It is not necessary to perform both of the low-temperature ultrathin carbon film growth treatment and the carbon growth treatment. Only one of the treatments may be performed. The low-temperature ultrathin carbon film growth treatment is carried out using a plasma containing a carbon-based gas such as a methane gas at a temperature of 200° C. to 400° C. for a short time of approximately 30 seconds. The carbon growth treatment is carried out using a plasma containing a carbon-based gas such as a methane gas at a temperature of 300° C. to 700° C. It is preferred that a remote plasma is used to obtain a graphene layer with a high quality.

(Embodiment 3)

Figure 9:
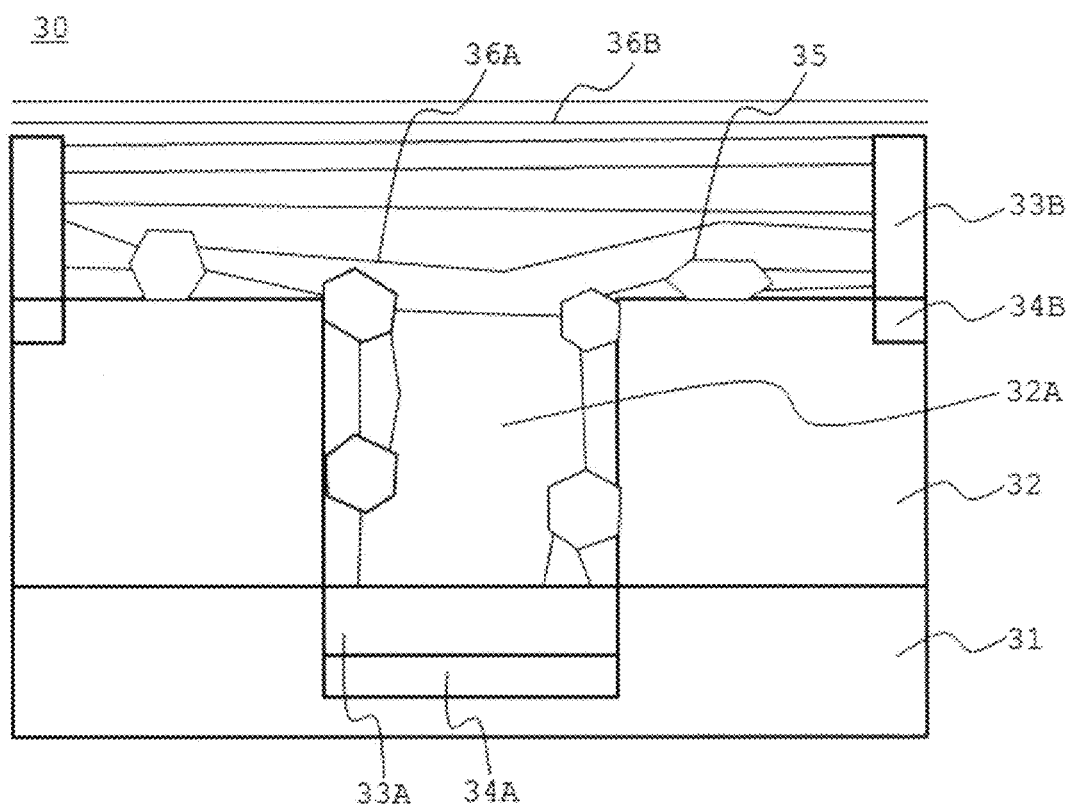
FIG. 9 is a conceptual view of a semiconductor device according to Embodiment 3.

FIG. 9 is a conceptual view of a semiconductor device 30 according to Embodiment 3. The semiconductor device 30 is intended to be used as a multi-layered structure device such as an LSI. The semiconductor device 30 contains a semiconductor substrate 31, an insulation film 32 disposed on the semiconductor substrate 31, a via hole 32A extending through the insulation film 32, bonding portion 34A embedded in a bottom of the via hole 32A, bonding portions 34B embedded in a surface of the insulation film 32, catalytic metal portions 33A and 33B disposed on the bonding portions 34A and 34B, fine catalytic metal particles 35 disposed on the insulation film 32, graphenes 36A disposed between the fine catalytic metal particles 35, between the fine catalytic metal particle 35 and the catalytic metal portion 33A, or between the fine catalytic metal particle 35 and the catalytic metal portion 33B, and graphenes 36B stacked over the graphenes 36A.

Figure 10:
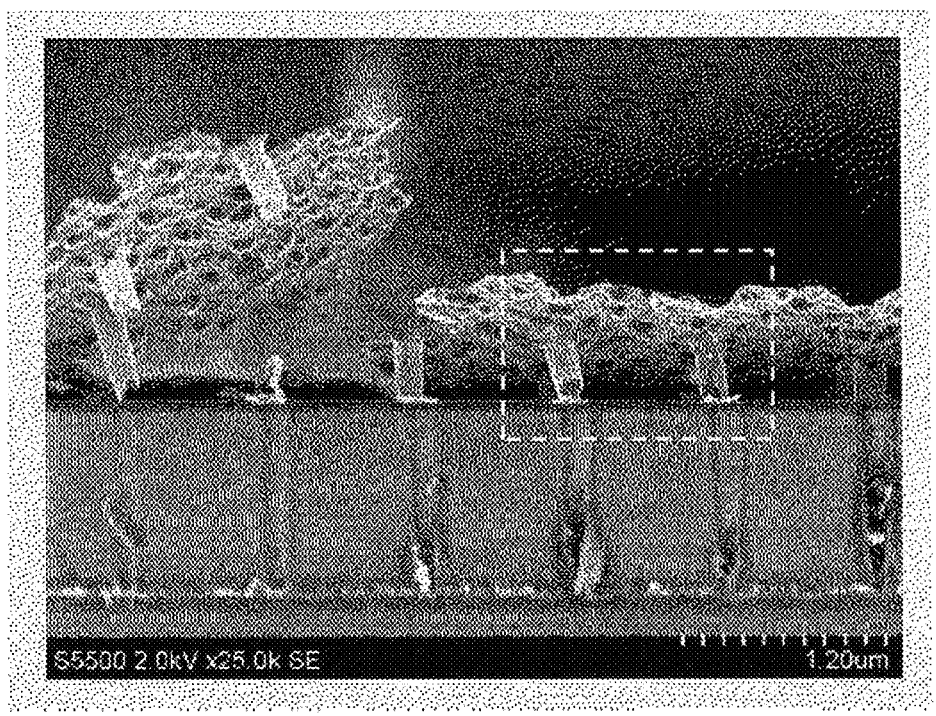
FIG. 10 is a secondary electron image of a conductive film according to Embodiment 3.
Figure 11:
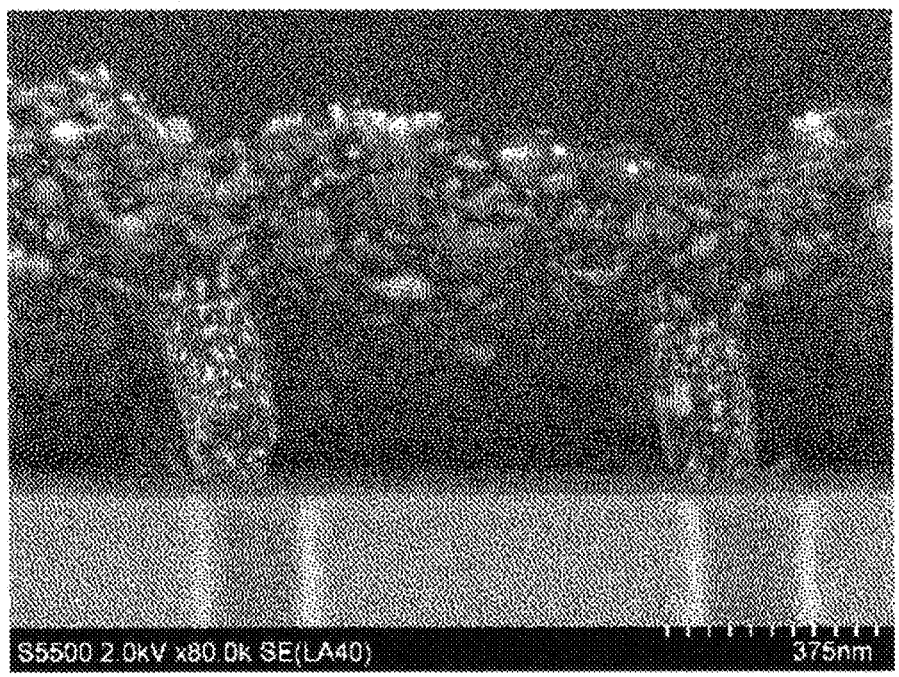
FIG. 11 is a reflection electron image of the conductive film of Embodiment 3.

SEM images of a conductive film in the semiconductor device 30 of FIG. 9 are shown in FIGS. 10 and 11. FIG. 10 is a secondary electron image at 25,000-fold magnification. The conductive film is partially peeled off to easily observe the film in the via hole. The conductive film portion in the bottom of the via hole is removed by the peeling and thus cannot be observed. As is clear from FIG. 10, the conductive film continuously extends on the flat surface and the via hole. FIG. 11 is a reflection electron image of a region surrounded by a dashed line of FIG. 10 at 80,000-fold magnification. In the reflection electron image, bright portions correspond to the fine catalytic metal particles (Ni particles) with a large atomic weight. The carbons (graphene layers) with a small atomic weight have a dark color approximately equal to that of the background, and therefore cannot be discriminated. As is clear from FIGS. 10 and 11, the fine catalytic metal particles having different particle diameters are dispersed in the conductive film, and a conductive network is formed by the combination of the particles and the graphenes.

In Embodiment 3, a micropore or via wiring and a flat surface wiring can be grown in a seamless manner in the conductive film. In general, in a case where a carbon nanotube is grown in a vertical direction and a graphene is grown in a transverse direction, another conductive component is required for connecting the carbon nanotube and the graphene. In contrast, in Embodiment 3, the three-dimensional conductive graphene network can be formed only by growing the graphenes from the junctions (starting points) of the fine catalytic metal particles 35. Thus, the graphene wiring can be extended in desired vertical and transverse directions. The graphenes tend to grow along a wall surface. Therefore, only by forming the fine catalytic metal particles on a wall surface with a desired shape, the seamless graphene wiring can be formed along the wall surface.

(Embodiment 4)

Figure 12:
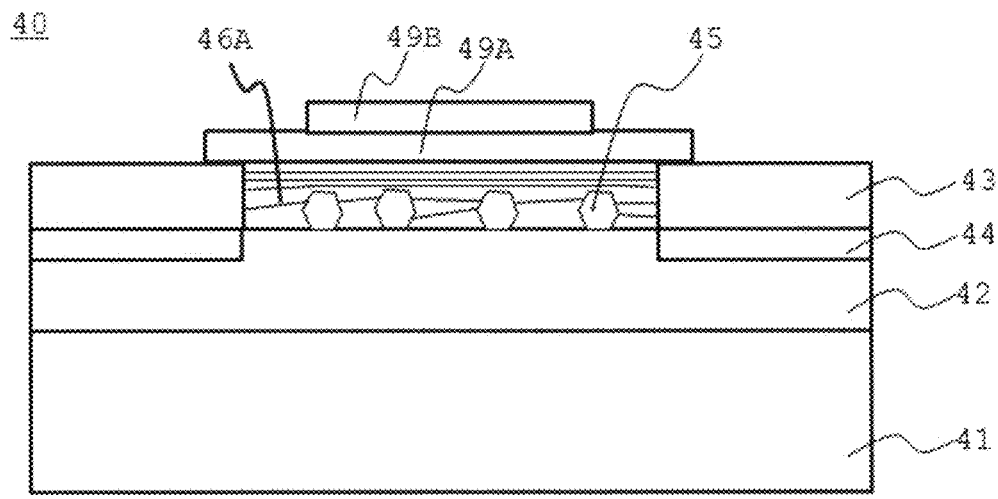
FIG. 12 is a conceptual view of a semiconductor device according to Embodiment 4.

FIG. 12 is a conceptual view of a semiconductor device 40 according to Embodiment 4. The semiconductor device 40 is intended to be used as a transistor device. The semiconductor device 40 contains a transistor-functional substrate 41, an insulation film 42 disposed on the substrate 41, bonding portions 44 embedded in a surface of the insulation film 42, catalytic metal portions 43 disposed on the bonding portions 44, fine catalytic metal particles 45 disposed on the insulation film 42, graphenes 46A disposed between the fine catalytic metal particles 45 or between the fine catalytic metal particle 45 and the catalytic metal portion 43, a gate insulation film 49A disposed on the graphenes 46A, and a gate electrode 49B disposed on the gate insulation film 49A. When the graphenes are used as a channel region for carrying a current in a transistor, the transistor in Embodiment 4 can advantageously exhibit a high mobility. This is because the graphenes are not in contact with the insulation film 42.

(Embodiment 5)

Figure 13:
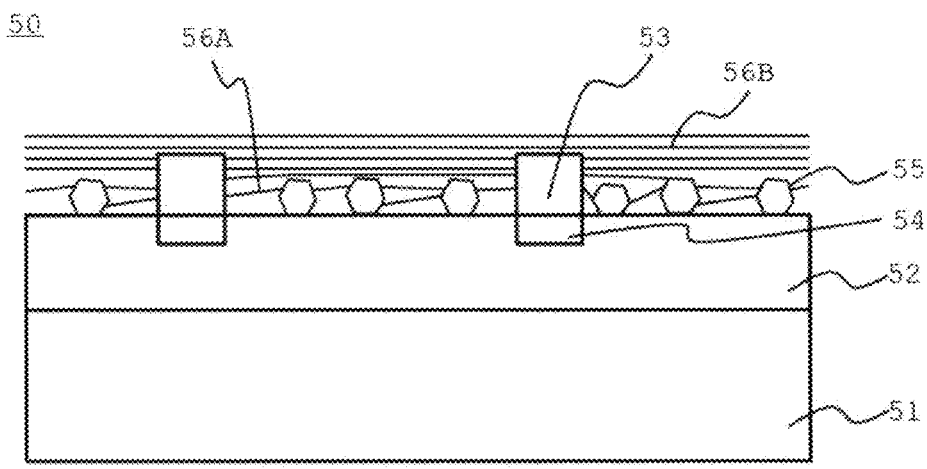
FIG. 13 is a conceptual view of a semiconductor device according to Embodiment 5.

FIG. 13 is a conceptual view of a semiconductor device 50 according to Embodiment 5. The semiconductor device 50 is intended to be used as a photoelectric conversion device. The semiconductor device 50 contains, for example, a photoelectric conversion layer 51 containing a buffer layer, a light absorption layer, an electrode, and a support substrate, a semi-insulation film 52 containing ZnO or the like disposed on the photoelectric conversion layer 51, bonding portions 54 embedded in a surface of the semi-insulation film 52, catalytic metal portions 53 disposed on the bonding portions 54, fine catalytic metal particles 55 disposed on the semi-insulation film 52, graphenes 56A disposed between the fine catalytic metal particles 55 or between the fine catalytic metal particle 55 and the catalytic metal portion 53, and graphenes 56B stacked over the graphenes 56A. In Embodiment 5, the conductive film is used as a transparent electrode. When the patterns of the catalytic metal portions 53 and the bonding portions 54 are optimized, the resultant transparent electrode can be excellent in current property and light transmission. In addition, since the graphenes have a high mechanical strength and an excellent bending property, the transparent electrode can be used in a flexible display or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A conductive film comprising:
    fine catalytic metal particles as a junction;
    a graphene extending in a network form from the junction; and
    an insulation film,
    a gap is formed between the insulation film and the graphene, and the fine catalytic metal particles are dispersed on the insulation film.

2. The conductive film according to claim 1, having a three-dimensional structure.

3. The conductive film according to claim 1, further comprising a graphene free from the fine catalytic metal particles, stacked over the graphene extending in the network form from the junction.

4. The conductive film according to claim 1, wherein the fine catalytic metal particles contain at least one selected from Cu, Ni, Co, Fe, Ru, Ti, In, and Pt.

5. The conductive film according to claim 3, further comprising catalytic metal portions on the insulation film,
    wherein the graphene free from the fine catalytic metal particles is between the catalytic metal portions.

6. The conductive film according to claim 5,
    wherein the catalytic metal portions has a facet.

7. The conductive film according to claim 6,
    wherein the facet has an {nn0} or {n00} surface.

8. The conductive film according to claim 5,
    wherein the catalytic metal portions contain at least one selected from Cu, Ni, Co, Fe, Ru, Ti, In, and Pt.

9. The conductive film according to claim 5, further comprising bonding portions containing a metal or compound selected from Ti, TiN, and TaN,
    wherein the bonding portions are between the catalytic metal portions and insulation film.

10. The conductive film according to claim 1,
    wherein the graphene extending in a network form from the junction is between the fine catalytic metal particles.

* * * * *